(12) United States Patent
Yoshida et al.

(10) Patent No.: US 6,381,166 B1
(45) Date of Patent: Apr. 30, 2002

(54) SEMICONDUCTOR MEMORY DEVICE HAVING VARIABLE PITCH ARRAY

(75) Inventors: Hiroyuki Yoshida, Machida; Toshiyuki Nagata, Tokyo; Atsushi Satoh, Nakakoma-gun; Shuzoh Shiosaki, Tsuchiura, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/399,841

(22) Filed: Sep. 21, 1999

Related U.S. Application Data
(60) Provisional application No. 60/102,058, filed on Sep. 28, 1998.

(51) Int. Cl.[7] .................................................. G11C 5/06
(52) U.S. Cl. ........................................... 365/63; 365/51
(58) Field of Search ........................................ 365/63, 51

(56) References Cited

U.S. PATENT DOCUMENTS

| | | | |
|---|---|---|---|
| 4,694,428 A | * 9/1987 | Matsumura et al. | 365/189 |
| 5,058,058 A | * 10/1991 | Yasuda et al. | 365/51 |
| 5,227,996 A | * 7/1993 | Uchida | 365/72 |
| 5,305,252 A | * 4/1994 | Saeki | 365/63 |
| 5,345,417 A | * 9/1994 | Crotti | 365/185 |
| 5,534,724 A | * 7/1996 | Nagamine | 257/390 |
| 5,621,697 A | * 4/1997 | Weng et al. | 365/230.06 |
| 5,629,887 A | * 5/1997 | Nakano et al. | 365/51 |
| 5,732,010 A | * 3/1998 | Takashima et al. | 365/63 |
| 5,767,754 A | * 6/1998 | Ikeda et al. | 257/393 |
| 5,903,022 A | * 5/1999 | Takashima et al. | 257/296 |
| 6,023,084 A | * 2/2000 | Tadaki et al. | 257/298 |
| 6,172,898 B1 | * 1/2001 | Kajiyama | 365/149 |

\* cited by examiner

*Primary Examiner*—Richard Elms
*Assistant Examiner*—Tuan T. Nguyen
(74) *Attorney, Agent, or Firm*—W. James Brady, III; Frederick J. Telecky, Jr.

(57) ABSTRACT

A memory cell array (300) is disclosed having variable pitch word lines and bit lines. The word lines include central word lines (302a) having a first pitch, and peripheral word lines (302b), situated proximate to the edge of the array (300), having a second pitch that is greater than the first pitch. In a similar fashion, the bit lines include central bit lines (304a) having a third pitch, and peripheral bit lines (304b), situated proximate to the edge of the array (300), having a fourth pitch that is greater than the third pitch. The increase in word line and bit line pitch can reduce the adverse results of proximity effects caused by the junction of the dense array features with the relatively open features of the adjacent periphery circuits.

36 Claims, 4 Drawing Sheets

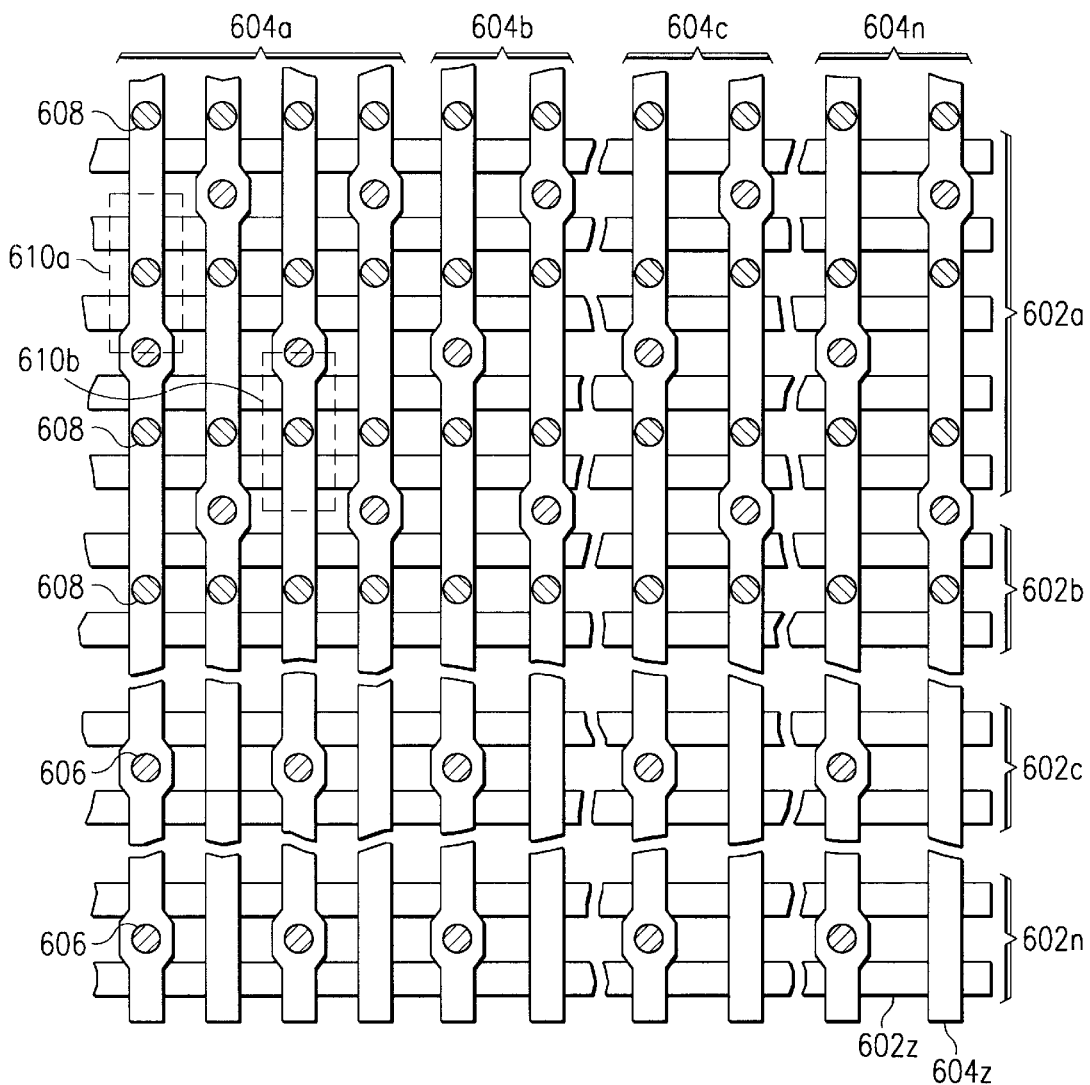

SEMICONDUCTOR MEMORY DEVICE HAVING VARIABLE PITCH ARRAY

This application claim benefit to Provisional application 60/102,058 filed Sep. 28, 1998.

TECHNICAL FIELD

The present invention relates generally to semiconductor memory devices, and more particularly to the arrangement of memory cell arrays within a semiconductor memory device.

BACKGROUND OF THE INVENTION

The fabrication of semiconductor devices typically includes the depositing and patterning of fabrication layers. In general, the fabrication of a device can start with the patterning of a semiconductor substrate into active area portions separated from one another by insulation. Subsequent alternating insulation and conductive layers are then formed over, and sometimes coupled to the substrate, to create and interconnect various circuit elements (such as transistors, capacitors and the like).

The patterning of an insulation or conductive layer usually involves a lithography and etch step. The lithography step involves depositing an alterable material, referred to as a "resist" on the layer that is to be patterned. The resist is then "developed" or "printed" into a pattern by the application of some form of radiation. For example, "photoresists" can be patterned by the application of light. Other resists can be patterned by x-rays, electron beams or ion beams, to name just a few examples. The pattern within a resist is typically developed by situating a "mask" containing the desired pattern over the resist. The mask includes "transparent" portions that will allow radiation to pass through, and "blocking" portions that will block the radiation. When the radiation is applied, the areas of resist situated below the transparent mask portions will be developed, those below blocking portions will not be developed. The undeveloped portions of resist can then be removed with a solvent, leaving the desired pattern over the fabrication layer.

The developed pattern of resist can then serve as an etch mask for the fabrication layer below. An etch can be applied, and those portions of the fabrication layer that are covered by the etch mask will be protected from the etch. The exposed portions will be removed. In this manner structures or "features" are formed in the fabrication layer by the etch step. For example, in the event the fabrication layer is a conductive layer, the etch step can create conductive interconnects between various portions of a device. In the event the fabrication layer is an insulation layer, the etch step can create contact holes through the insulation layer to a conductive layer below.

In order to fabricate as small a semiconductor device as possible, and hence produce such devices in a more cost effective manner, efforts are continually made to form features with as small a size as possible. The smallest manufacturable feature size is often referred to as a minimum feature size. The minimum feature size will determine how close structures can be situated relative to one another in the semiconductor device.

In addition to impacting the resulting size of a semiconductor device, feature sizes can also play an important part in the functionality of a semiconductor device. For example, in order to create accurate etch mask patterns from a layer of resist, sufficient radiation must be applied to the resist to print the pattern. However, as masks are made for devices having increasingly smaller features sizes, it becomes more and more difficult to control the resulting radiation intensity necessary to produce uniform feature sizes across a semiconductor device.

One particular type of semiconductor device in which minimum feature sizes can play an important role is the semiconductor memory device. Semiconductor memory devices typically include an array of densely packed memory cells, surrounded by a periphery of ancillary circuits. An example of a semiconductor memory device is set forth in a top plan view in FIG. 1, The memory device is designated by the general reference character 100 and shown to include a memory cell array 102 surrounded by a periphery region 104. The memory cell array 102 can include thousands of memory cells accessed by word lines and bit lines (not shown in FIG. 1). FIG. 1 further includes a number of dots, one of which is shown as item 106. Each of the dots represents the location of failed memory cells. As shown in the figure, the failed memory cells 106 are prevalent on the peripheral (edge) portions of the memory cell array 102.

The prevalence of failed memory cells on the peripheral portions of the array is further understood by referring to FIG. 2. FIG. 2 sets forth a corner portion of the memory cell array 102, shown as item 108 in FIG. 1. The array portion of FIG. 2 is identified by the general reference character 200, and illustrates word lines 202 and bit lines 204. The bit lines 204 are separated from one another by a uniform distance (shown as d1). Similarly, the word lines 202 are separated from one another by a uniform distance (shown as d2). The right-most bit line can be considered to define a right edge of the array, and the bottom-most word line can be considered to define a bottom edge of the array. Typically, the word lines 202 and bit lines 204 are formed with minimum feature sizes, and minimum distances between adjacent lines (pitch). Consequently, the memory cell array has a much higher feature density than the surrounding peripheral portions of the semiconductor memory device.

A problem associated with situating dense features (such as a memory cell array) adjacent to less dense features (such as those found in the periphery of a memory device) is that of proximity effects. Proximity effects result in non-uniform transferring of a pattern from a mask to the resist layer below. Such effects can arise in photolithography due to the diffraction of light caused by the difference in feature densities. Proximity effects are also known to incur in other types of lithography systems, such as those utilizing electron beam lithography. Thus, while a given mask pattern will produce a given feature in the central portion of the array, using the same mask in the periphery array can result in different feature sizes, and hence defects on the edge of the array.

One approach for addressing the adverse results of proximity effects is to include sacrificial ("dummy") memory cells on the periphery of the array. Referring once again to FIG. 2, the portion of the array 200 is shown to include dummy rows of memory cells 206 and dummy columns of memory cells 208. The dummy memory cells are not functional and serve to "absorb" the proximity effect caused by the junction of the memory cell array and the periphery.

As the feature sizes of semiconductor devices continues to shrink, proximity effects will require more and more dummy memory cells. Such use of increased numbers of dummy memory cells can waste valuable area in the memory device.

It would be desirable to arrive at some way to address proximity effects without having to increase the number of sacrificial devices, such as dummy memory cells as is the case in semiconductor memory devices.

SUMMARY OF THE INVENTION

According to the preferred embodiment, a semiconductor memory device includes an array of memory cells arranged into rows and columns. The memory cells of like columns are commonly coupled to a bit line, the memory cells of like rows are commonly coupled to a word line. While the majority of the bit lines and word lines within the memory cell array have the same spacing (pitch), the word lines and bit lines on the periphery of the array have an increased pitch. As a result, the proximity effects on the edge of the memory cell array can be reduced, and fewer dummy memory cells are required.

According to one aspect of the preferred embodiment, the increase in pitch of bit lines and word lines on the periphery of the array is 5%–10% greater than that of the other word lines and bit lines of the array.

According to another aspect of the preferred embodiment, the semiconductor memory device is a dynamic random access memory having one transistor-one capacitor memory cells.

BRIEF DESCRIPTION OF THE DRAWINGS

FIG. 6 illustrates a top plan view of a folded bit line dynamic random access memory array according to the preferred embodiment.

DETAILED DESCRIPTION OF THE EMBODIMENTS

Figure 3:
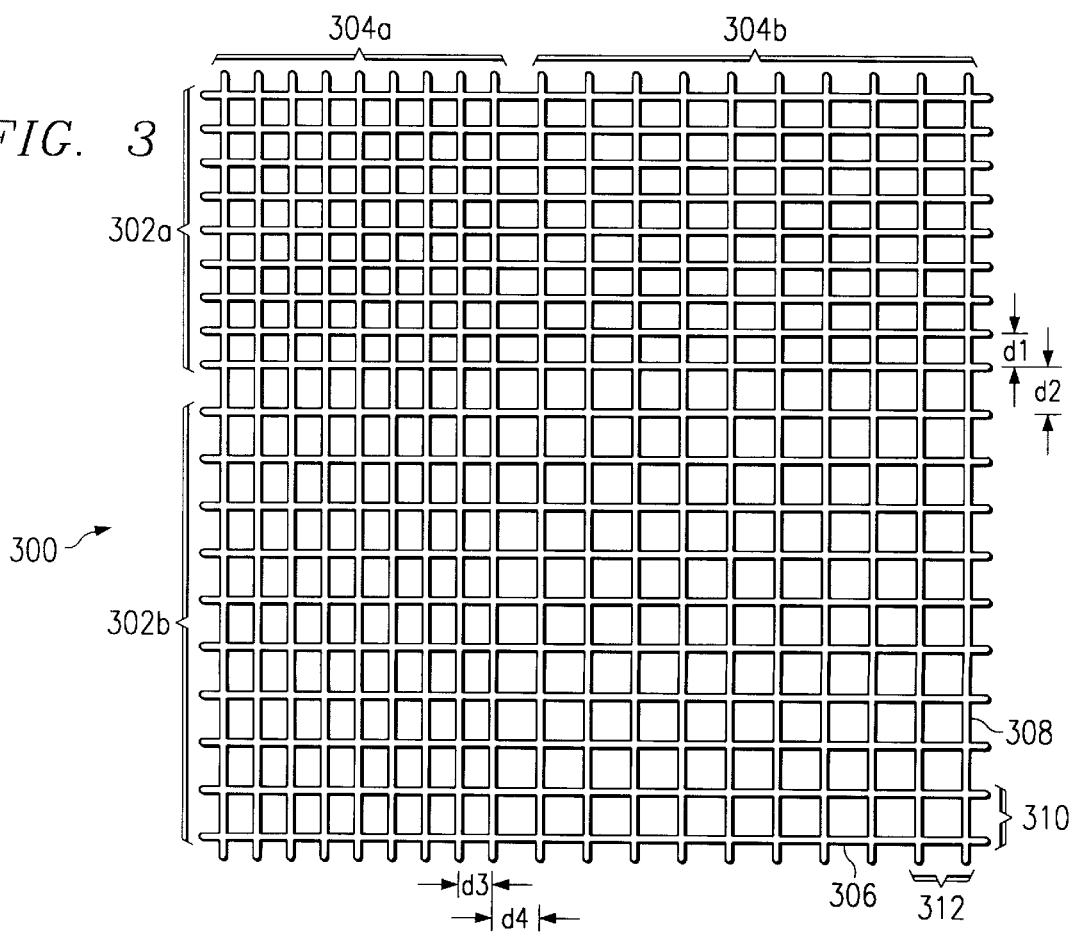
FIGS. 3 and 4 are top plan views illustrating a memory cell array according to the preferred embodiment.

The preferred embodiment is a semiconductor memory device array arrangement that reduces the adverse results caused by proximity effects on the edge of the memory cell array. Word line and bit line pitch is increased on the peripheral portions of the array, thereby reducing the abruptness in feature density at the edge of the memory cell array. An array according to the preferred embodiment is set forth generally in top plan view in FIG. 3, which illustrates the word line and bit line arrangement of the array. A portion of the array is designated by the general reference character 300, and is shown to include central word lines 302a, peripheral word lines 302b, central bit lines 304a and peripheral bit lines 304b. It is understood that the portion of the array set forth in FIG. 3 represents a similar portion to that shown as item 108. Thus, FIG. 3 can be considered to be a lower right-hand corner of an array, with the bottom-most word line 306 delineating a first edge of the array, and the right-most bit line 308 delineating a second edge of the array. The array will continue to extend in the upward and left directions in the view of FIG. 3.

In the particular embodiment set forth in FIG. 3, the distance between the central word lines 302a is uniform, the pitch being shown as d1. In contrast, the distance between peripheral word lines 302b is greater than that of the central word lines 302a, and is shown as d2. It is understood that the difference in pitch between the central word lines 302a and the peripheral word lines 302b has been exaggerated in FIG. 3 to better illustrate the change in pitch. In the preferred embodiment, the pitch of the peripheral word lines (d2) is created by increasing the pitch of the central word lines d1) by 5% to 10%. The increase in word line pitch toward the bottom of the array reduces proximity effects caused by the junction of the bottom edge with less feature dense peripheral circuits.

In a similar fashion to the word lines (302a and 302b) the central bit lines 304a are separated from one another by a pitch shown as d3, and the peripheral bit lines 304b are separated from one another by a pitch shown as d4. The pitch d4 is greater than d3. In a like manner to the word line arrangement, the increase in bit line pitch toward the right edge of the array reduces proximity effects caused by the junction of the right edge with peripheral circuits having less feature density. The bit line distances shown in FIG. 3 are also exaggerated to better illustrate the difference in pitch. In the preferred embodiment, the pitch d4 is 5%–10% greater than the pitch d3.

The variable word line and bit line pitch of the preferred embodiment may not completely eliminate edge cell defects. Accordingly, the particular embodiment of FIG. 3 includes a row of dummy memory cells along the bottom edge of the array, indicated by character 310, and a column of dummy memory cells along the right edge of the array, indicated by character 312.

Figure 4:
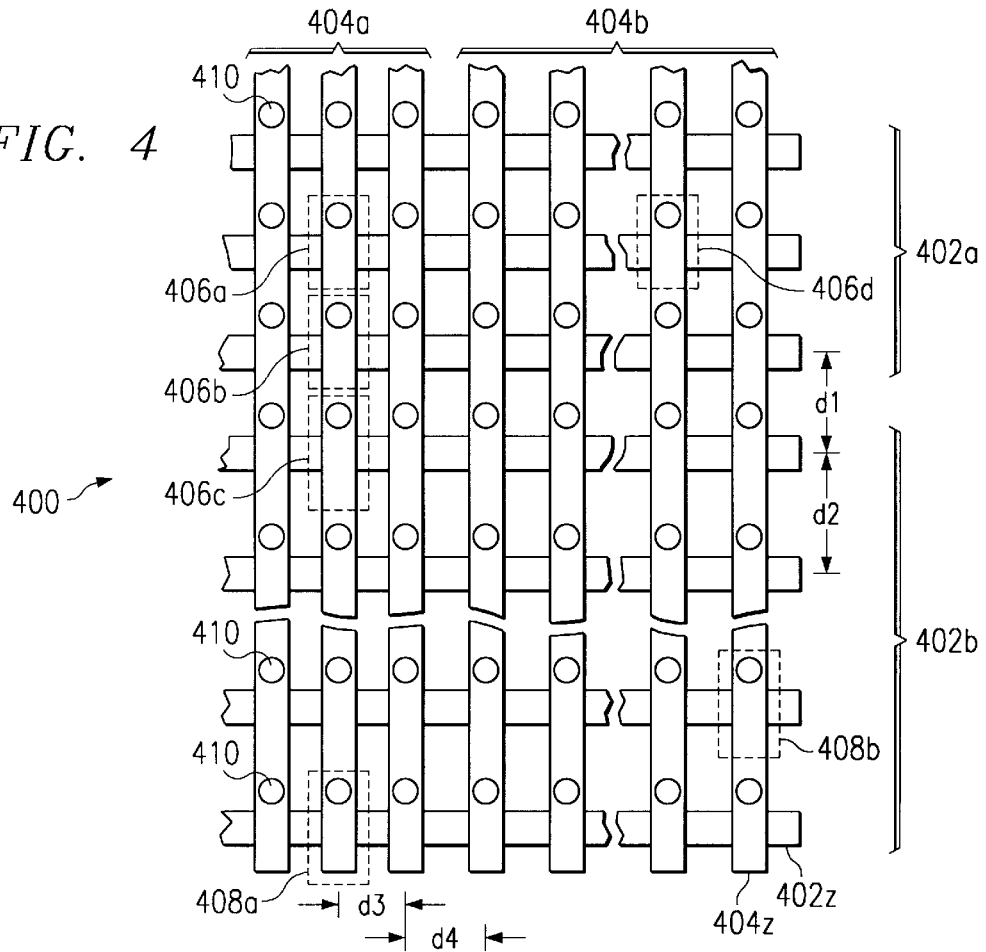

Referring now to FIG. 4 a second top plan view is set forth, illustrating in a general sense, the connection of word lines and bit lines to the memory cells below. A memory cell array 400 includes central word lines 402a, peripheral word lines 402b, central bit lines 404a, and peripheral bit lines 404b. The pitch of the central word lines 402a is shown as d1, and is less than the pitch of the peripheral word lines 402b, shown as d2. Similarly, the pitch of the central bit lines 404a is shown as d3, and is less than the pitch of the peripheral word lines 404b, shown as d4. A terminal word line 402z defines a first terminal edge of the array, and is disposed over a row of dummy memory cells. Similarly, a terminal bit line 404z defines a second terminal edge of the array, and is coupled to a column of dummy memory cells.

Situated below, and generally at the intersection of each word line and bit line, is a memory cell. Four standard memory cells (406a–406d) and two dummy memory cells (408a and 408b) are identified in particular, but it is understood that an entire array of such memory cells are formed in the semiconductor substrate. Each memory cell (406a–406d and 408a–408b) has a word line disposed over it. In the event the memory cells included metal(conductor)-oxide(insulator)-semiconductor (MOS) transistors, the word line could form the gate electrode of the MOS transistors. In the event the memory cells included other types of devices (e.g., bipolar transistors) the word line would be connected to the control electrodes thereof (e.g., the base electrode). Each memory cell (406a–406d and 408a–408b) is further connected to one or more of the bit lines (404a or 404b) by a bit line contact structure. The bit line contact structures are represented by circular symbols in the view of FIG. 4. Two such bit line contacts are identified in FIG. 4 by the reference character 410.

Figure 1:
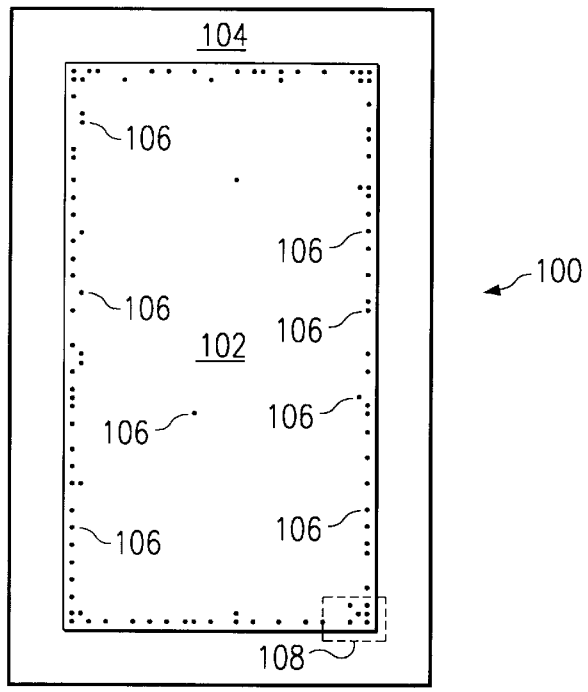
FIG. 1 is a top plan view of a prior art semiconductor memory device.
Figure 5A:
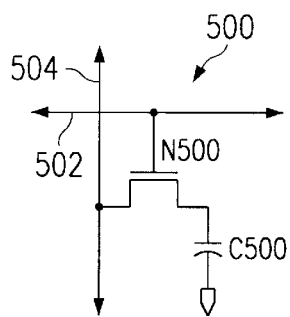
FIGS. 5A–5D are schematic diagrams of memory cells that can be utilized in the preferred embodiment.

FIGS. 5A–5D set forth four examples of memory cells that may be used in the variable pitch array according to the preferred embodiment. It is understood that the four memory cell illustrated are exemplary, and in no way exhaustive. FIG. 5A sets forth a one-transistor-one capacitor dynamic random access memory (DRAM) cell. The memory cell is designated by the general reference character 500, and is shown to include an n-channel MOS access transistor N500 coupled to a storage capacitor C500. The use of variable pitch word lines and bit lines can be particularly advantageous in DRAM application due to the compact size of DRAM memory cells. Such compact memory cell sizes produce very small bit line and word line pitches, and hence can result in proximity effects on the peripheral edges of the array. A word line 502 is shown coupled to the gate of transistor N500, and a bit line 504 is shown coupled to the source of transistor N500.

Figure 5B:
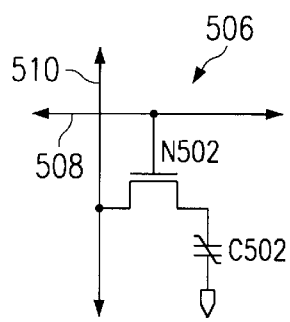

FIG. 5B illustrates a one-transistor-one capacitor ferroelectric random access memory (FeRAM) cell. The FeRAM cell is designated by the general reference character 506, and is shown to include an n-channel MOS access transistor N502 coupled to a ferroelectric capacitor C502. Like the DRAM cell, the FeRAM cell is very compact. Thus, FeRAM arrays can utilize the variable pitch approach of the preferred embodiment to reduce proximity effects. A word line 508 drives the gate of transistor N502 and a bit line 510 is coupled to source of transistor N502.

Figure 5C:
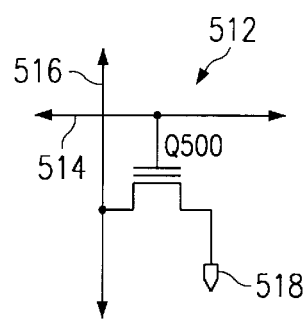

FIG. 5C sets forth a one transistor electrically erasable and programmable read-only-memory (EEPROM) cell that may be utilized in the preferred embodiment. The EEPROM cell is designated by the general reference character 512, and is formed by an NMOS floating gate transistor Q500. Transistor Q500 has a gate coupled to a word line 514 and a drain coupled to a bit line 516. It is noted that the source of transistor Q500 is shown to have a source coupled to common source node 518. The common source node 518 may be coupled in the row and/or column direction to other memory cells in an EEPROM array. Accordingly, it is understood that while FIGS. 3 and 4 illustrate variable pitch word lines and bit lines, in the event an EEPROM included common source lines, such source lines could have increasing pitch at the periphery of the array.

Figure 5D:
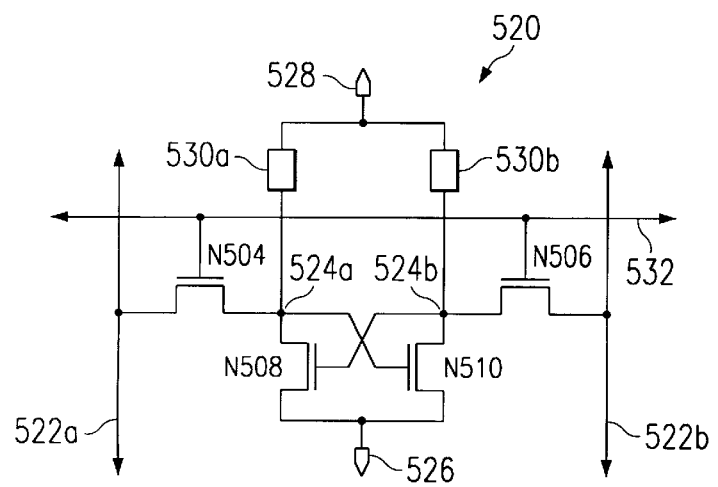
Figure 2:
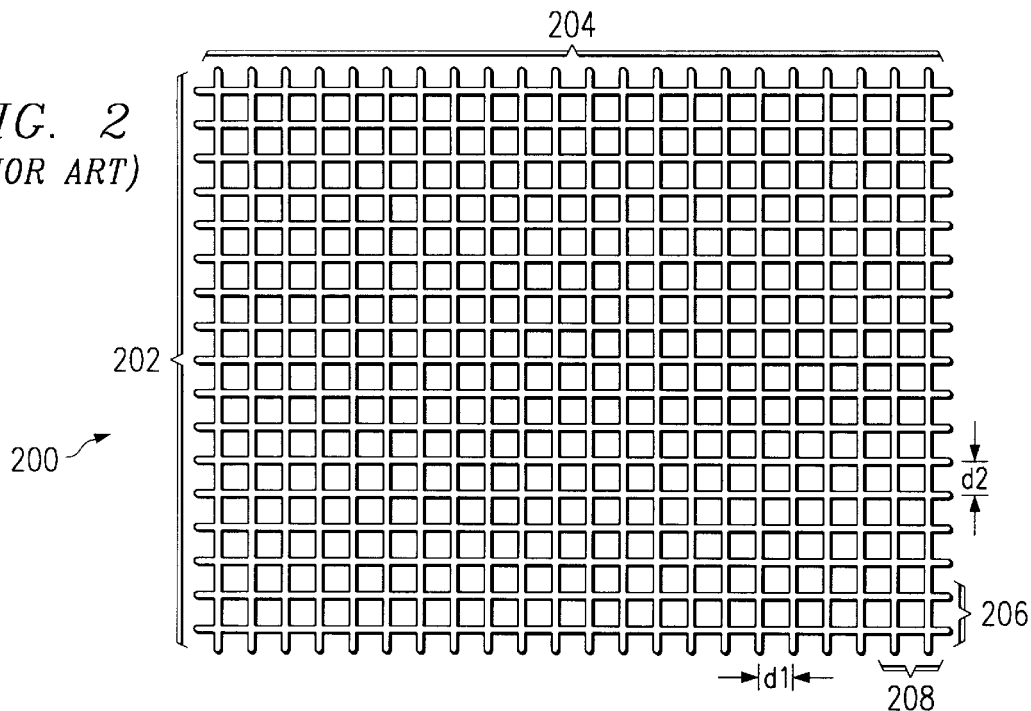
FIG. 2 is a top plan view illustrating the bit lines and word lines of a portion of a prior art memory cell array.

FIG. 5D illustrates one example of a static random access memory (SRAM) cell, and is designated by the general reference character 520. The SRAM cell 520 includes n-channel MOS access transistors N504 and N506 coupled between a pair of bit lines (522a and 522b) and a corresponding pair of storage nodes (524a and 524b). The storage nodes (524a and 524b) are coupled to a first power supply node 526 by cross-coupled n-channel MOS transistors N508 and N510. The storage nodes (524a and 524b) are further coupled to a second power supply node 528 by a corresponding pair of load devices (530a and 530b). The gates of access transistors N504 and N506 are commonly coupled to a word line 532.

The example of FIG. 5D serves to illustrate that while FIG. 4 sets forth memory cells (406a–406d and 408a–408b) associated with a single bit line, the preferred embodiment could include memory cells coupled to bit line pairs. In such a case, each memory cell would be disposed below a bit line pair. In addition, like the source node 518 of the EEPROM example of FIG. 5C, in an SRAM array the first power supply node 526 and/or second power supply node 528 may be commonly coupled to other memory cells of the same row or column by a power supply line. Such power supply lines could have increased pitch on the periphery of the array.

Accordingly, the preferred embodiment utilization of variable array pitch can be used in a variety of applications. Provided unit circuits (such as the memory cells set forth in FIGS. 5A–5D) are densely packed, and commonly connected by parallel conductive lines, increased pitch of conductive lines on peripheral devices can be used to address proximity effects.

FIG. 6 is top plan view of a DRAM array having a "folded" bit line architecture. In a folded bit line architecture, when a word line is activated, memory cell data will be placed on one bit line while an adjacent bit line is set to a reference voltage. Folded bit line architectures provide a dense array with a higher degree of noise immunity than other DRAM architectures. The DRAM array of FIG. 6 is designated by the general reference character 600, and is shown to include central word lines 602a, first increased pitch word lines 602b, second increased pitch word lines 602c, and last increased pitch word lines 602n. In a similar fashion, the DRAM array 600 includes central bit lines 604a, first increased pitch bit lines 604b, second increased pitch bit lines 604c, and last increased pitch bit lines 604n. Two edges of the DRAM array 600 are defined by a last word line 602z and a last bit line 604z.

FIG. 6 illustrates a case in which the word lines and bit lines have an increasingly larger pitch, the closer they are to the edge of the array. For example, central bit lines 602a have a uniform pitch (a minimum pitch for example). The first increased pitch word lines 602b are closer to the bottom edge of the array than the central word lines 602a, and have a greater pitch than the central word lines 602a. The second increased pitch word lines 602c are closer to the bottom edge of the array than the first increased pitch word lines 602b, and so have a greater pitch than the first increased word lines 602b. Finally, last increased pitch word lines 602n are closest to the bottom edge of the array, and so have a greater pitch than the second increased pitch word lines 602c.

In the particular arrangement of FIG. 6, the bit lines exhibit a similar increase in pitch. Last increased pitch bit lines 604n, closest to the right edge of the DRAM array 600, have a relatively large pitch. Second increased pitch bit lines 604b, which are further from the array edge, have a smaller pitch than the last increased pitch bit lines 604b. Finally, first increase pitch bit lines 604b, which are further from the right edge of the DRAM array 600, have an even smaller pitch. The central bit lines 604a have a uniform pitch, that may be a minimum pitch.

It is understood that the increase in pitch of the word lines need not be linear. That is, along the bit line (column) direction, particular number of word lines may have one pitch, and be adjacent to a lesser or greater number of word lines having a greater pitch. Groups of word lines would be arranged in this manner up to the bottom (and top) edges of the array. Similarly, the increase in bit line pitch need not be linear. Groups of bit lines, including different numbers of bit lines, could have different pitches up to the right (and left) edges of the array. It is further noted that the increase in pitch is exaggerated in FIG. 6 to better illustrate the increase in pitch. As noted above, in the preferred embodiment, the increased pitch word lines and bit lines would have pitches that are 5% to 10% greater than that of the central word lines and central bit lines, respectively.

In the DRAM array of FIG. 6, bit line contacts are set forth by circular symbols having horizontal hatching. One particular bit line contact is shown as item 606 in FIG. 6. Due to the folded bit line arrangement of the DRAM array 600, unlike the general illustration of FIG. 4, bit line contacts appear on alternating bit lines in the word line (row) direction. FIG. 6 also includes capacitor contacts, shown by circular symbols with vertical hatching. One particular capacitor contact is shown as item 608 in FIG. 6. It is understood that a storage capacitor is coupled to each capacitor contact.

FIG. 6 further indicates the location of two DRAM memory cells, shown as items 610a and 610b. The arrangement of memory cells shows that in the DRAM array 600, bit line contacts 606 are shared by memory cells of adjacent rows.

Figure 7:
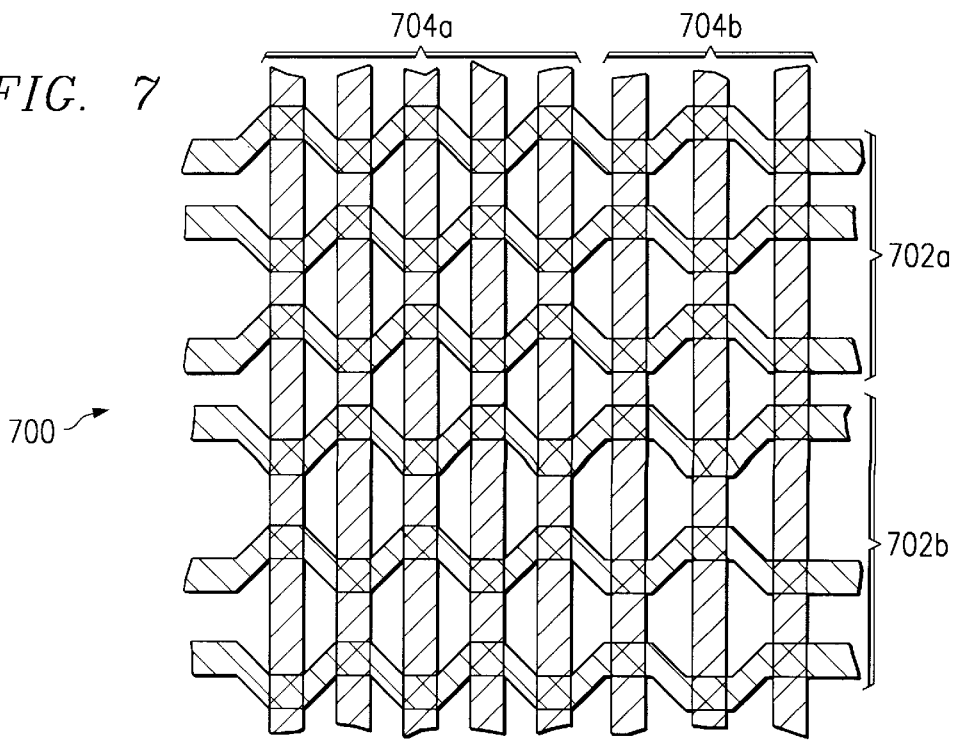
FIG. 7 is a top plan view of a memory cell array having irregularly shaped word lines according to the preferred embodiment.

FIG. 7 sets forth yet another example of an array according to the preferred embodiment. The array of FIG. 7 is designated by the general reference character 700, and is shown to include central word lines 702a having a uniform pitch, and peripheral word lines 702b having a pitch greater than that of the central word lines 702a. In addition, central bit lines 704a are disposed generally perpendicular to the word lines (702a and 702b), and have a given pitch. Peripheral bit lines 704b, which are closer to the edge of the array than the central bit lines 704a, have a pitch that is greater than that of the central bit lines 704a. FIG. 7 illustrates a case in which the word lines have an irregular (i.e., not straight) shape. Thus, irregularly shaped adjacent word lines (and bit lines) can also benefit from the teachings of the preferred embodiment.

The various examples set forth herein have illustrated memory cell arrays having two conductive layers, one used to form word lines and another used to form bit lines. It is understood that multiple conductive layers could be used to form bit lines and/or word lines. For example, in order to reduce the effective resistance of word lines, it is know to "strap" polysilicon word lines by coupling the polysilicon word lines to an overlying parallel metallization layer. In such a case, the word lines straps (the overlying metallization layer) would also have variable pitch.

Thus, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. A semiconductor memory device, comprising:
    a memory cell array including a plurality of memory cells arranged in a first direction into a number of columns; and
    a plurality of bit lines, each bit line being coupled to the array in the first direction, the bit lines including a group of consecutive first bit lines and a group of consecutive second bit lines, the first bit lines being separated from one another in a second direction, generally perpendicular to the first direction, by a first pitch distance, the second bit lines being separated from one another in the second direction by a distance that is greater than the first pitch distance.

2. The semiconductor memory device of claim 1, wherein:
    the second bit lines are each separated from one another by a second pitch distance that is greater than the first pitch distance.

3. The semiconductor memory device of claim 1, wherein:
    the second bit lines are separated from one another by a distance that is 5% to 10% greater than the first pitch distance.

4. The semiconductor memory device of claim 1, wherein:
    the second bit lines are separated from one another by distances that increase in the second direction.

5. The semiconductor memory device of claim 1, wherein:
    the memory cell array includes at least a first terminal edge disposed in the first direction, and the second bit lines are disposed adjacent to the first terminal edge.

6. The semiconductor memory device of claim 5, wherein:
    the memory cell array includes a central portion, the central portion including first bit lines.

7. The semiconductor memory device of claim 5, wherein:
    the memory cell array includes at least one column of dummy memory cells adjacent to the first terminal edge.

8. The semiconductor memory device of claim 1, further including:
    the memory cells being further arranged within the memory cell array into a number of rows; and
    a plurality of word lines, each word line being coupled to the array in the second direction, the word lines including a group of consecutive first word lines and a group of consecutive second word lines, the first word lines being separated from one another in the first direction by a third pitch distance, the second word lines being separated from one another in the first direction by a distance that is greater than the third pitch distance.

9. The semiconductor memory device of claim 8, wherein:
    the second word lines are each separated from one another by a fourth pitch distance that is greater than the third pitch distance.

10. The semiconductor memory device of claim 8, wherein:
    the second word lines are separated from one another by a distance that is 5% to 10% greater than the first pitch distance.

11. The semiconductor memory device of claim 8, wherein:
    the second word lines are separated from one another by distances that increase in the first direction.

12. The semiconductor memory device of claim 8, wherein:
    the memory cell array includes at least a second terminal edge disposed in the second direction, and the second word lines are disposed adjacent to the second terminal edge.

13. The semiconductor memory device of claim 12, wherein:
    the memory cell array includes a central portion, the central portion including first word lines.

14. The semiconductor memory device of claim 12, wherein:
    the memory cell array includes at least one row of dummy memory cells adjacent to the second terminal edge.

15. The semiconductor memory device of claim 1, wherein:
    the memory cells are dynamic random access memory cells.

16. The semiconductor memory device of claim 15, wherein:
    the memory cell array has a folded bit line architecture.

17. The semiconductor memory device of claim 1, wherein:
    the memory cells are electrically erasable and programmable read only memory cells.

18. The semiconductor memory device of claim 1, wherein:
    the memory cells are ferroelectric random access memory cells.

19. The semiconductor memory device of claim 1, wherein:
    the memory cells are static random access memory cells.

20. In a semiconductor memory device, a memory cell array arrangement for reducing edge memory cell failures, the arrangement including:
    a memory cell array formed within a semiconductor substrate, the limits of the memory cell array being defined by at least a first edge disposed in a first direction;
    a plurality of word lines coupled to the memory cells of the array, adjacent word lines separated by a word line pitch distance, the plurality of word lines including a first pair of adjacent word lines and a second pair of adjacent word lines, the first pair of adjacent word lines being closer to the first edge than the second pair of adjacent word lines, the first pair of adjacent word lines having a word line pitch distance greater than the word line pitch distance of the second pair of adjacent word lines.

21. The semiconductor memory device of claim 20, wherein:
    the word lines include peripheral word lines disposed proximate to the first edge, and central word lines disposed further from the first edge than the peripheral word lines.

22. The semiconductor memory device of claim 21, wherein:
the word line pitch distance of the central word lines is less than the word line pitch distance of the peripheral word lines.

23. The semiconductor memory device of claim 21, wherein:
the word line pitch distance of the central word lines is generally equal to a first distance, and the word line pitch distance of the peripheral word lines is generally equal to a second distance that is greater than the first distance.

24. The semiconductor memory device of claim 21, wherein:
the word line pitch distance of the central word lines is generally equal to a first distance, and the word line pitch distance of the peripheral word lines increases the closer a word line is to the first edge.

25. The semiconductor memory device of claim 20, further including:
the limits of the memory cell array are further defined by at least a second edge that is generally perpendicular to the first edge; and
a plurality of bit lines coupled to the memory cells of the array, adjacent bit lines separated by a bit line pitch distance, the plurality of bit lines including a first pair of adjacent bit lines and a second pair of adjacent bit lines, the first pair of adjacent bit lines being closer to the second edge than the second pair of adjacent bit lines, the first pair of adjacent bit lines having a bit line pitch distance greater than the bit line pitch distance of the second pair of adjacent bit lines.

26. The semiconductor memory device of claim 25, wherein:
the bit lines include peripheral bit lines disposed proximate to the second edge, and central bit lines disposed further from the second edge than the peripheral bit lines.

27. The semiconductor memory device of claim 26, wherein:
the bit line pitch distance of the central bit lines is less than the bit line pitch distance of the peripheral bit lines.

28. The semiconductor memory device of claim 26, wherein:
the bit line pitch distance of the central bit lines is generally equal to a third distance, and the bit line pitch distance of the peripheral word lines is generally equal to a fourth distance that is greater than the third distance.

29. The semiconductor memory device of claim 26, wherein:
the bit line pitch distance of the central bit lines is generally equal to a first distance, and the bit line pitch distance of the peripheral bit lines increases the closer a bit line is to the second edge.

30. A semiconductor memory device, comprising:
a plurality of unit circuits formed adjacent to one another in a semiconductor substrate to form a feature dense area, the unit circuits including central unit circuits surrounded by peripheral unit circuits, the peripheral unit circuits being situated on surrounding edges of the feature dense area;
a plurality of first conductive lines coupled to the unit circuits generally parallel to one another,
the first conductive lines that are coupled to the central unit circuits being separated from one another by a first distance,
the first conductive lines that are coupled to selected first peripheral unit circuits being separated from one another by a second distance that is greater than the first distance; and
a plurality of second conductive lines coupled to the unit circuits generally parallel to one another,
the second conductive lines that are coupled to the central unit circuits being separated from one another by a third distance,
the second conductive lines that are coupled to selected second peripheral unit circuits being separated from one another by a fourth distance that is greater than the third distance.

31. The semiconductor device of claim 30, wherein:
the unit circuits are memory cells.

32. The semiconductor device of claim 31, wherein:
the unit circuits are dynamic random access memory cells.

33. The semiconductor device of claim 31, wherein:
the unit circuits are arranged into columns disposed generally parallel to the first conductive lines; and
the first conductive lines are bit lines.

34. The semiconductor device of claim 31, wherein:
the unit circuits are arranged into rows disposed generally perpendicular to the first conductive lines; and
the second conductive lines are word lines.

35. The semiconductor device of claim 30, wherein:
the unit circuits are formed into an array having rows and columns, selected columns on the edge of the array including the peripheral unit circuits.

36. The semiconductor device of claim 30, wherein:
the unit circuits are formed into an array having rows and columns, selected rows on the edge of the array including the peripheral unit circuits.

* * * * *